US007436271B2

(12) United States Patent
Weinstein et al.

(10) Patent No.: US 7,436,271 B2
(45) Date of Patent: Oct. 14, 2008

(54) DIELECTRICALLY TRANSDUCED SINGLE-ENDED TO DIFFERENTIAL MEMS FILTER

(75) Inventors: Dana Weinstein, Ithaca, NY (US); Sunil Ashok Bhave, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 0 days.

(21) Appl. No.: 11/556,510

(22) Filed: Nov. 3, 2006

(65) Prior Publication Data

US 2007/0103258 A1    May 10, 2007

Related U.S. Application Data

(60) Provisional application No. 60/765,511, filed on Feb. 6, 2006, provisional application No. 60/733,695, filed on Nov. 4, 2005.

(51) Int. Cl.
H03H 9/46 (2006.01)
H03H 9/50 (2006.01)
H03H 9/52 (2006.01)
H03H 3/007 (2006.01)

(52) U.S. Cl. ............... 333/186; 333/197; 333/199; 438/50

(58) Field of Classification Search ......... 333/197–200, 333/186, 187
See application file for complete search history.

(56) References Cited

U.S. PATENT DOCUMENTS

| 3,634,787 | A * | 1/1972 | Newell ............... 333/186 |
| 6,393,913 | B1 * | 5/2002 | Dyck et al. ............ 73/504.12 |
| 6,429,755 | B2 * | 8/2002 | Speidell et al. ........... 333/197 |
| 6,489,864 | B2 * | 12/2002 | Frey et al. .............. 333/197 |
| 6,621,134 | B1 * | 9/2003 | Zurn ..................... 257/415 |
| 6,670,866 | B2 * | 12/2003 | Ella et al. ............... 333/133 |
| 6,680,660 | B2 * | 1/2004 | Nguyen ................. 333/133 |
| 6,856,217 | B1 * | 2/2005 | Clark et al. ............. 333/186 |
| 6,909,221 | B2 * | 6/2005 | Ayazi et al. ............ 310/321 |
| 7,142,832 | B2 * | 11/2006 | Inoue et al. ............ 455/129 |

(Continued)

OTHER PUBLICATIONS

Wang et al.; "1.156-GHz Self-Aligned Vibrating Micromechanical Disk Resonator"; IEEE Transactions on Ultrasonics, Ferroelectrics, and Frequency Control; vol. 51, No. 12, Dec. 2004, pp. 1607-1628.*

(Continued)

*Primary Examiner*—Barbara Summons
(74) *Attorney, Agent, or Firm*—Jaeckle Fleischmann & Mugel, LLP; Christopher B. Miller (57) ABSTRACT

A MEMS filter has an input layer for receiving a signal input, and an output layer for providing a signal output. The MEMS filter also has a first resonator and a second resonator coupled to the first resonator such that movement transduced in the first resonator by the signal input causes movement of the second resonator which transduces the signal output. A method of manufacturing a MEMS filter is also disclosed. A dielectric layer is formed on a base. A patterned electrode layer is formed at least in part on the dielectric layer. The base is etched to define a resonator structure. A method of adjusting a desired input impedance and an output impedance of a dielectrically transduced MEMS filter having transduction electrodes coupled to a dielectric film is further disclosed. The method includes adjusting a DC bias voltage on the transduction electrodes.

36 Claims, 11 Drawing Sheets

U.S. PATENT DOCUMENTS

| | | |
|---|---|---|
| 7,227,432 B2 * | 6/2007 | Lutz et al. .................... 333/186 |
| 7,227,433 B2 * | 6/2007 | Ginsburg et al. ............ 333/187 |
| 7,323,952 B2 * | 1/2008 | Pan et al. ..................... 333/186 |
| 2006/0017523 A1 | 1/2006 | Bhave et al. |
| 2007/0010227 A1 * | 1/2007 | Naniwada .................... 455/310 |
| 2007/0046398 A1 * | 3/2007 | Nguyen et al. ............... 333/186 |
| 2007/0070821 A1 * | 3/2007 | Weigold ...................... 368/168 |

OTHER PUBLICATIONS

Bhave, Sunil A. and Howe, Roger T.; Silicon Nitride-on-Silicon Bar Resonator Using Internal Electrostatic Transduction; Feb. 5, 2005 IEEE, pp. 2139-2142.

* cited by examiner

DIELECTRICALLY TRANSDUCED SINGLE-ENDED TO DIFFERENTIAL MEMS FILTER

RELATED APPLICATIONS

This application claims priority to U.S. provisional patent application 60/733,695, entitled, "DIELECTRICALLY TRANSDUCED SINGLE-ENDED TO DIFFERENTIAL MEMS FILTERS", filed on Nov. 4, 2005. This application also claims priority to U.S. provisional patent application 60/765,511, entitled, "DIELECTRICALLY TRANSDUCED SINGLE-ENDED TO DIFFERENTIAL MEMS FILTERS", filed on Feb. $6^{th}$, 2006. Both the 60/733,695 and the 60/765,511 provisional patent applications are hereby incorporated by reference in their entirety.

TECHNICAL FIELD

The claimed invention relates to MEMS filters, and, more particularly, to dielectrically transduced single-ended to differential MEMS filters.

BACKGROUND

Sensor network transceivers and cell phones, such as GSM and W-CDMA cell phones, which depend on differential signal paths, use baluns to convert single ended signals of an antenna to differential signals used as inputs to low noise amplifiers (LNAs), and also to transform the antenna impedance (typically 50Ω) to the LNA input impedance (200Ω), a 1:4 impedance transformation. The balun is a bulky off-chip device which increases the size and expense of devices for which it is required. Therefore, it would be desirable to be able to eliminate the off-chip balun while still allowing impedance-matched conversion of single-ended signals to differential signal.

SUMMARY

A MEMS filter has an input layer for receiving a signal input, and an output layer for providing a signal output. The MEMS filter also has a first resonator and a second resonator coupled to the first resonator such that movement transduced in the first resonator by the signal input causes movement of the second resonator which transduces the signal output.

A method of manufacturing a MEMS filter is disclosed. A dielectric layer is formed on a base. A patterned electrode layer is formed at least in part on the dielectric layer. The base is etched to define a resonator structure.

A method of adjusting a desired input impedance and an output impedance of a dielectrically transduced MEMS filter having transduction electrodes coupled to a dielectric film is also disclosed. The method includes adjusting a DC bias voltage on the transduction electrodes.

A radio frequency (RF) apparatus is disclosed. The RF apparatus has an input configured to receive an input RE signal and a plurality of MEMS filters. Each MEMS filter has an input layer for receiving a signal input and an output layer for providing a signal output. Each MEMS filter also has a first resonator and a second resonator coupled to the first resonator such that movement transduced in the first resonator by the signal input causes movement of the second resonator which transduces the signal output, and wherein each of the first and second resonators are tuned to allow different frequency bands to pass from the signal input to the signal output. The RE apparatus also has switching circuitry which routes the input RE signal to a desired MEMS filter from the plurality of MEMS filters. The RE apparatus further has an output configured to provide the signal output from the desired MEMS filter.

A MEMS filter is further disclosed. The MEMS filter has a frame, an output resonator coupled to the frame by anchor beams, and an input resonator coupled to the output resonator by at least one coupling beam. The MEMS filter also has an input dielectric layer covering at least part of the input resonator and an output dielectric layer covering at least part of the output resonator. The MEMS filter further has an input electrode covering at least part of the input dielectric layer and configured to receive an input signal comprising an input DC bias voltage and a single-ended RF voltage signal from a device with a first impedance, wherein the combination of the input DC bias voltage and the single-ended RF voltage signal compresses the input dielectric layer and drives a movement of the input resonator. The MEMS filter also has a first output electrode covering at least part of the output dielectric layer and a second output electrode covering at least another part of the output dielectric layer. The first and second output electrodes are configured to receive an output DC bias voltage. Movement of the input resonator tends to cause movement of the output resonator depending on the characteristics of the input signal, the input DC bias voltage, the anchor beams, the at least one coupling beam, the input dielectric layer, and the input electrode. Movement of the of the output resonator creates a differential output signal, at a second impedance, between the first output electrode and the second output electrode depending on characteristics of the output DC bias voltage, the output dielectric layer, the first output electrode, and the second output electrode.

It will be appreciated that for purposes of clarity and where deemed appropriate, reference numerals have been repeated in the figures to indicate corresponding features, and that the various elements in the drawings have not necessarily been drawn to scale in order to better show the features of the invention.

DETAILED DESCRIPTION

Figure 1A:
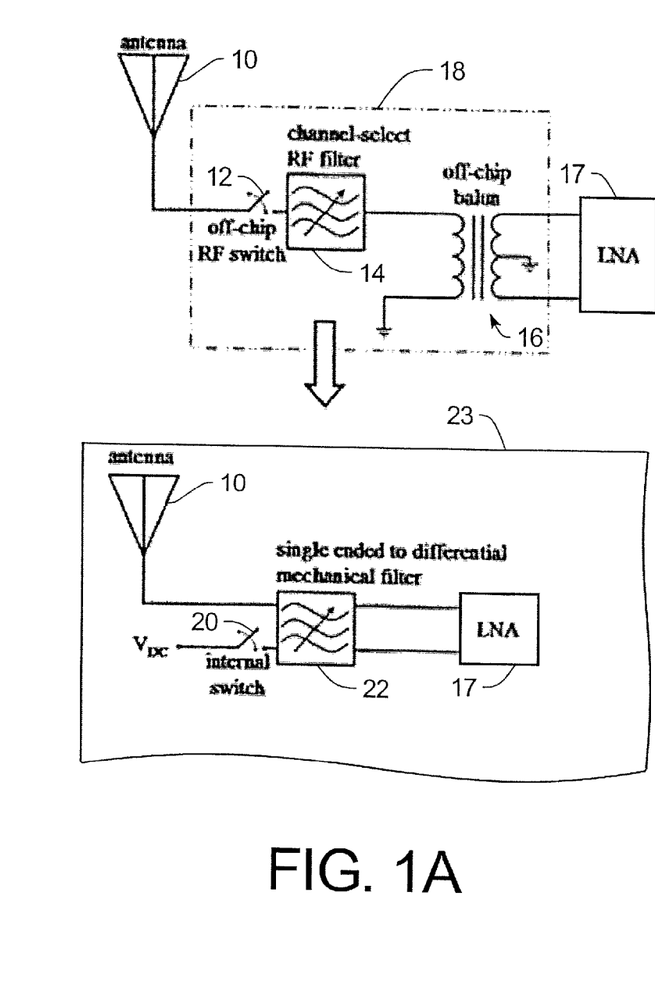
FIGS. 1A and 1B are schematic diagrams showing antenna interface circuitry having a balun and conventional filter together with an alternative circuit wherein an embodiment of a single-ended to differential filter replaces the balun and conventional filter.

Turning now to the drawings, specifically FIG. 1A, an antenna 10 is connected to a series circuit of an off-chip RF switch 12 and a channel-select RF filter 14 that is connected to one terminal of the primary winding of a balun transformer 16, the secondary terminals of which provide differential inputs to an LNA 17. The off-chip RF switch 12, channel-select RF filter 14, and the balun transformer 16, within a dashed line box 18, are shown replaced by a bias voltage internal switch 20 and an embodiment of a single-ended to differential filter 22 inside a receiver 23. Thus, the single-ended to differential filter 22 eliminates the need for the bulky off-chip balun transformer 16, and the RF switch 12 has been replaced by a bias voltage switch 20 which can be placed on the same chip as the single-ended to differential filter 22.

Figure 1B:
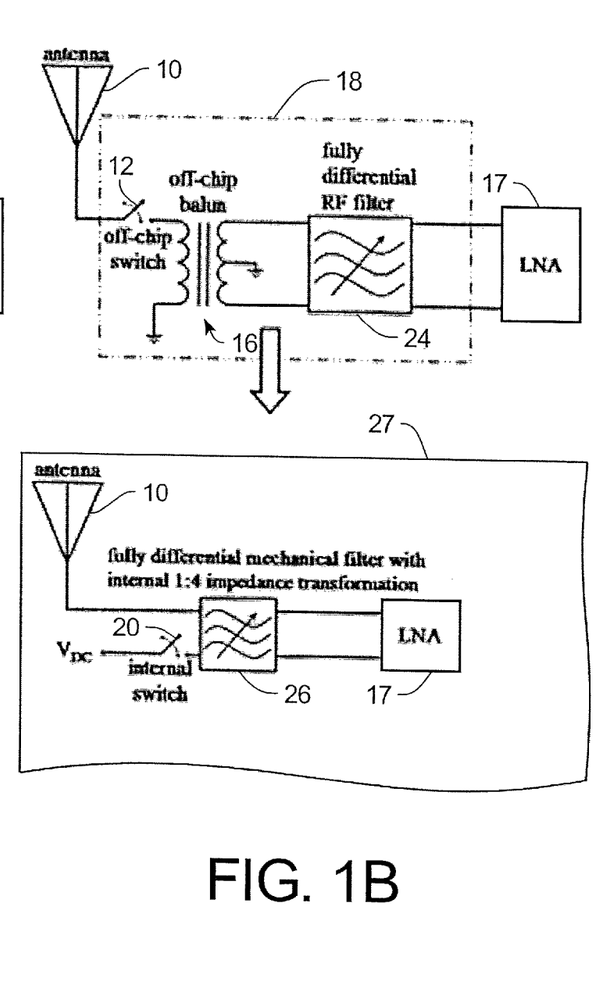

FIG. 1B is a schematic diagram similar to FIG. 1A with the balun transformer 16 placed between the off-chip RF switch 12 and a fully differential RF filter 24. The off-chip RF switch 12, balun transformer 16, and fully differential RF filter 24, within a dashed line box 25, are shown replaced by the bias voltage internal switch 20 and another embodiment of a single-ended to differential filter 26 inside a receiver 27. The single-ended to differential filter 26 provides a 1:4 impedance transformation in this embodiment.

Figure 2A:
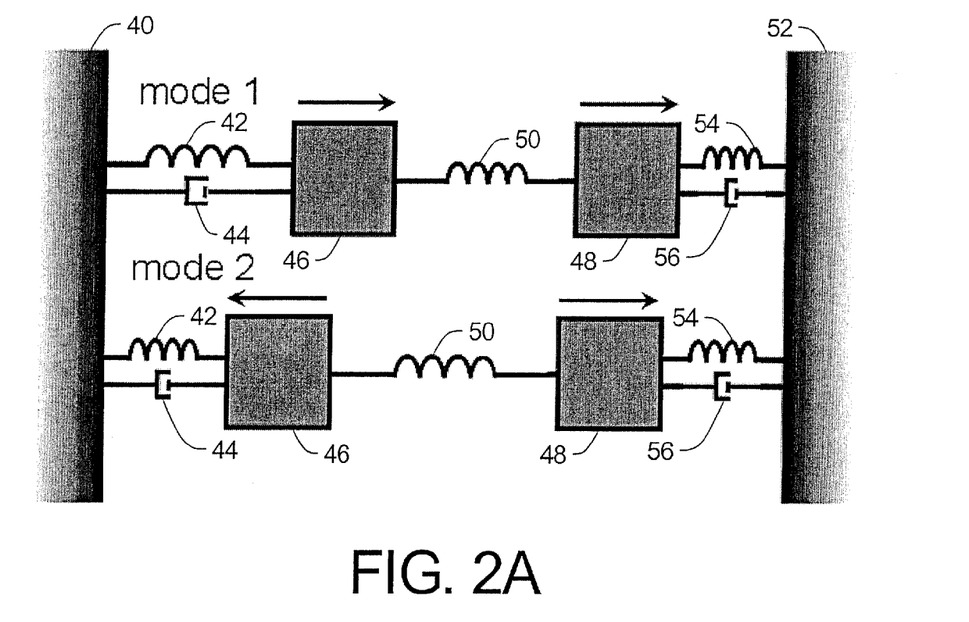
FIG. 2A is a diagram of a mechanical equivalent of portions of the resonators used in some embodiments of MEMS filters.

FIG. 2A is a diagram of a mechanical equivalent of portions of the resonators used in the dielectrically transduced MEMS filters described herein. A first stationary support 40 has attached to it a first spring 42 in parallel with a first damping device 44, the other ends of which are attached to a first mass 46 which, in turn, is coupled to a second mass 48 by a second spring 50. The second mass 48 is coupled to a second stationary support 52 by the parallel combination of a third spring 54 and a second damping device 56. Two of these structures are shown in FIG. 2A to illustrate two modes of operation of the resonators. In the upper diagram representing mode 1, the first mass 46 is moved to the right causing the first spring 42 attached to the first stationary support 40 to elongate while the spring 50 stays the same length and the third spring 54 becomes compressed such that the masses 46 and 48 move simultaneously to the right. In the lower diagram representing mode 2 the spring 50, after first being compressed and then decompressing farther than its original length, causes the first mass 46 to move to the left while the second mass 48 continues to move to the right. Thus the initial movement of the mass 48 results in a rightward and then a leftward movement of the mass 48 while the mass 50 moves to the right.

Figure 2B:
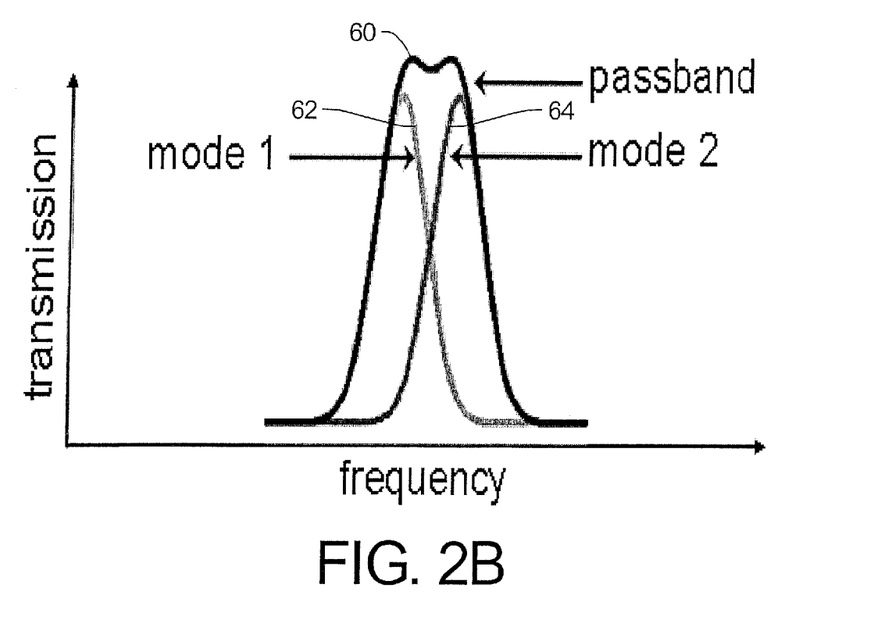
FIG. 2B is a graphical representation of the transmission characteristics of the mechanical equivalent shown in FIG. 2A.

FIG. 2B is a graphical representation of the transmission characteristics of the mechanical equivalent shown in FIG. 2A. The structure shown in FIG. 2B is a passband filter in which the passband 60 is the combination of the transmission through the resonator during mode 1 represented by curve 62, and the transmission through the resonator during mode 2 represented by curve 64. The offset of the center frequencies of the curves 62 and 64 advantageously widens the passband 60. To lessen the attenuation of a signal through the resonator, the motional impedance of resonator, as well as the effective stiffness of the springs 44 and 52, should be as low as possible.

Figure 3A:
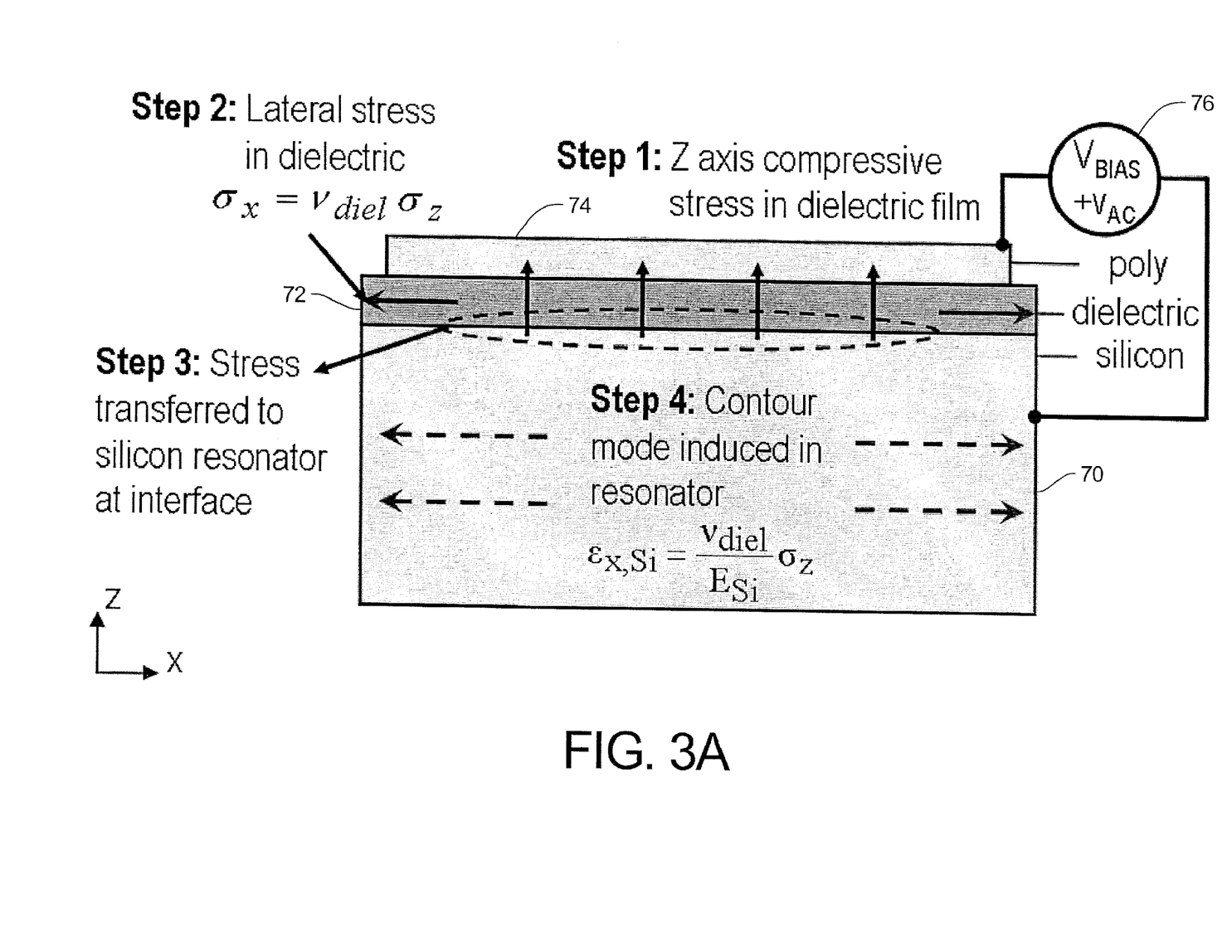
FIG. 3A is a partial cross sectional diagram of the dielectric activation end of one embodiment of a MEMS filter with a superimposed electrical diagram and mechanical stress diagram.

FIG. 3A is a partial cross-sectional diagram of the dielectric activation end of the filters described herein with a superimposed electrical diagram and mechanical stress diagram. This diagram and the diagram shown in FIG. 3B were presented by Bhave, Sunil A. et al., "Silicon Nitride-On-Silicon Bar Resonator Using Internal Electrostatic Transduction," 13$^{th}$ International Conference on Solid-State Sensors, Actuators and Microsystems (Transducers 2005), Seoul, Korea, Jun. 5-9, 2005, pp. 2139-2142, and later published in the Proceedings of the conference. In FIG. 3A the silicon layer 70 has deposited upon it a dielectric layer 72 of hafnium dioxide which is 30 nm thick in the resonator shown in FIG. 5A and 20 nm thick in the resonator shown in FIG. 8A. Shown in FIG. 3A is a heavily doped polysilicon layer 74 on top of the hafnium dioxide layer 72. The polysilicon layer 74 is an electrode layer for the input and output signals. An electrical signal consisting of a DC component and an AC component 76 is applied across the polysilicon layer 74 and the silicon layer 70. As a result of the applied signal, the varying electrostatic field between the polysilicon layer 74 and the silicon layer 70, vertical compression forces are created in the dielectric layer 72 which create lateral forces in the dielectric layer 62 according to the following formula;

$$\sigma_x = v_{diel}\sigma_z$$

where $\sigma_x$ is the lateral stress in the dielectric layer 72, $v_{diel}$ is the propagation velocity of the dielectric layer 72, and $\sigma_z$ is the vertical stress in the dielectric layer 72.

The vertical stress in the dielectric layer 72 is transferred at the interface between the dielectric layer 72 and the silicon layer 70 to the silicon layer 70 and thus to the silicon resonator. The stress induced in the silicon layer 70 is contoured by the shape of the resonator and thereby provide the passband characteristics of the filter, and also determine the input and output characteristic impedances of the filter. The strain $\in$ of the silicon layer 70 is given by $$\varepsilon_{x,Si} = \frac{v_{diel}}{E_{Si}}\sigma_z$$

where $E_{Si}$ is Young's modulus for silicon.

Figure 3B:
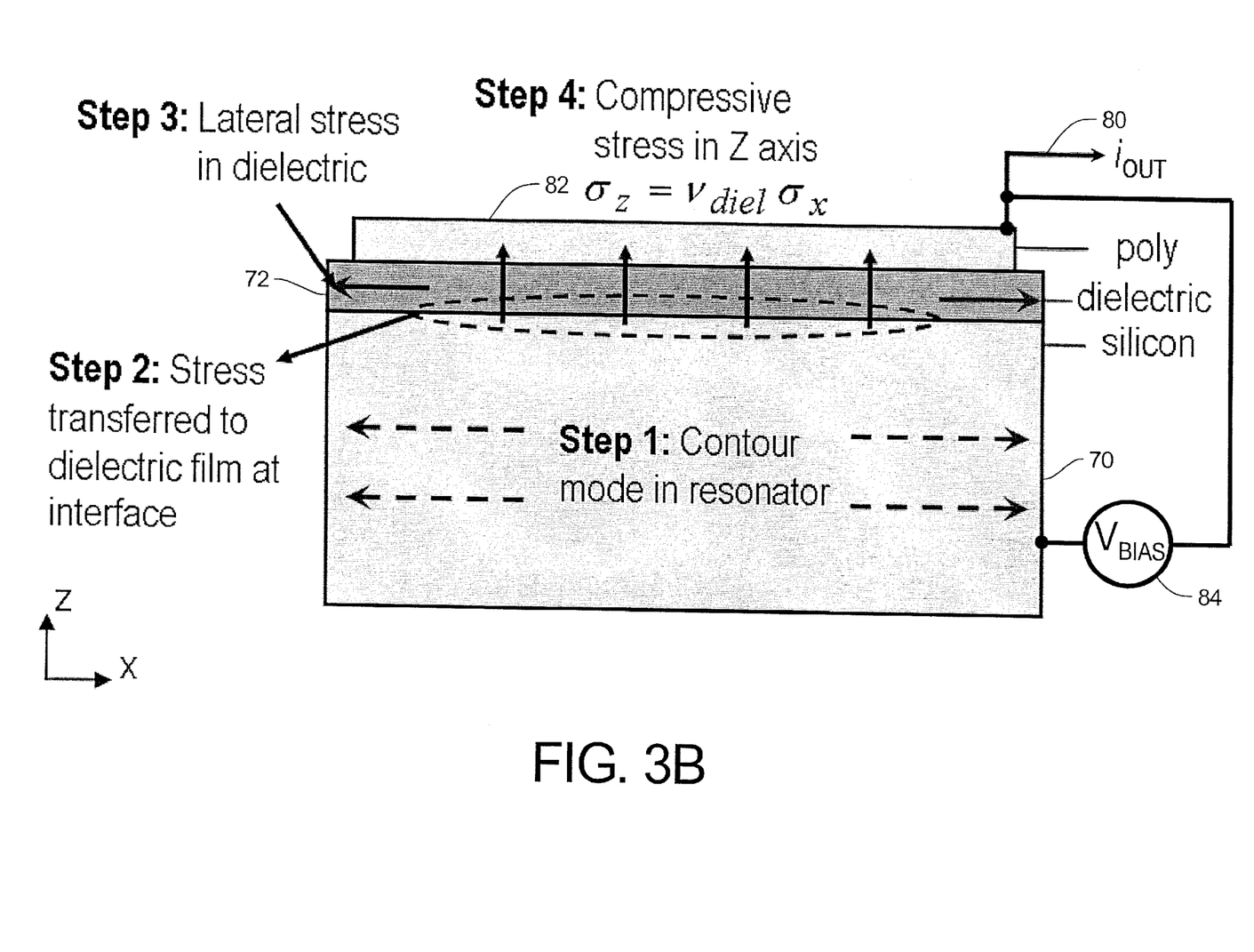
FIG. 3B is a partial cross sectional diagram of the dielectric sensing end of one embodiment of a MEMS filter with a superimposed electrical diagram and mechanical stress diagram.

FIG. 3B is a partial cross-sectional diagram of the dielectric sensing end of a filter according to an embodiment of the present invention with a superimposed electrical diagram and mechanical stress diagram. The $i_{OUT}$ signal on line 80 is the filtered AC signal applied to the polysilicon layer 82 in FIG. 3A. The stress propagation and electrical signal generation are the same as shown in FIG. 3A, except in reverse. The polysilicon layer 82 is biased with respect to the silicon layer 70 by a DC bias voltage $V_{BIAS}$ 84. Both the DC bias at the dielectric activation end (input) of the filter shown in FIG. 3A and the DC bias at the dielectric sensing end (output) of the filter shown in FIG. 3B must be present when the filter is to be active, and removing either DC bias will disable the filter.

Figure 4A:
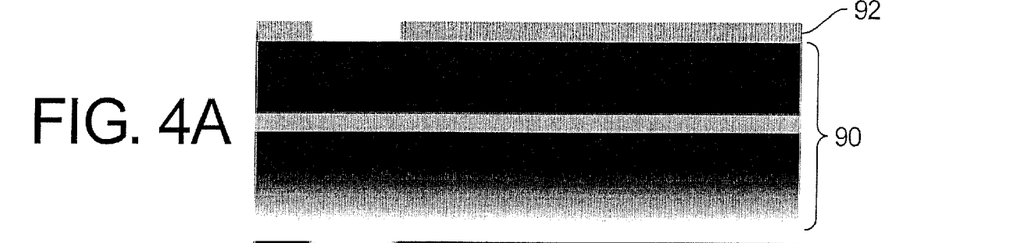
FIGS. 4A, 4B, 4C, 4D, and 4E are schematic side cross-sectional views illustrating one embodiment of processing steps used to fabricate a MEMS filter.
Figure 4B:
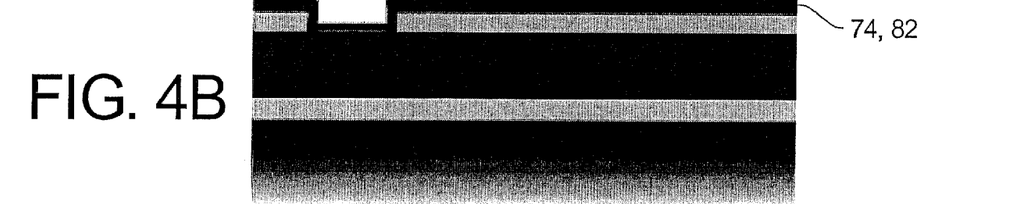
Figure 4C:
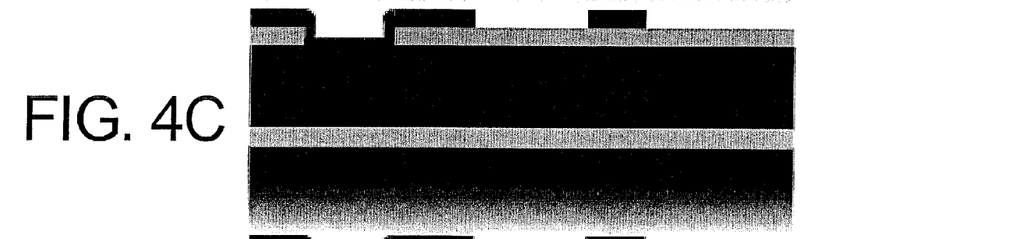
Figure 4D:
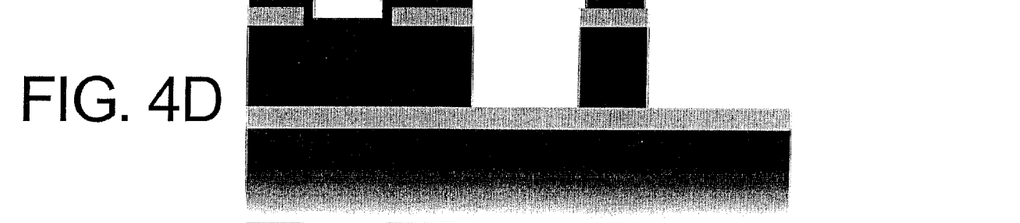
Figure 4E:
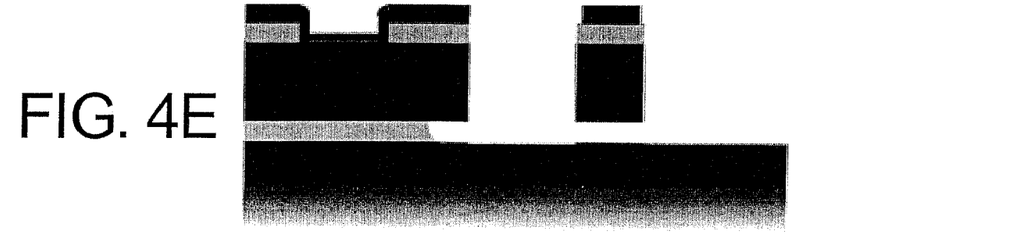
Figure 5A:
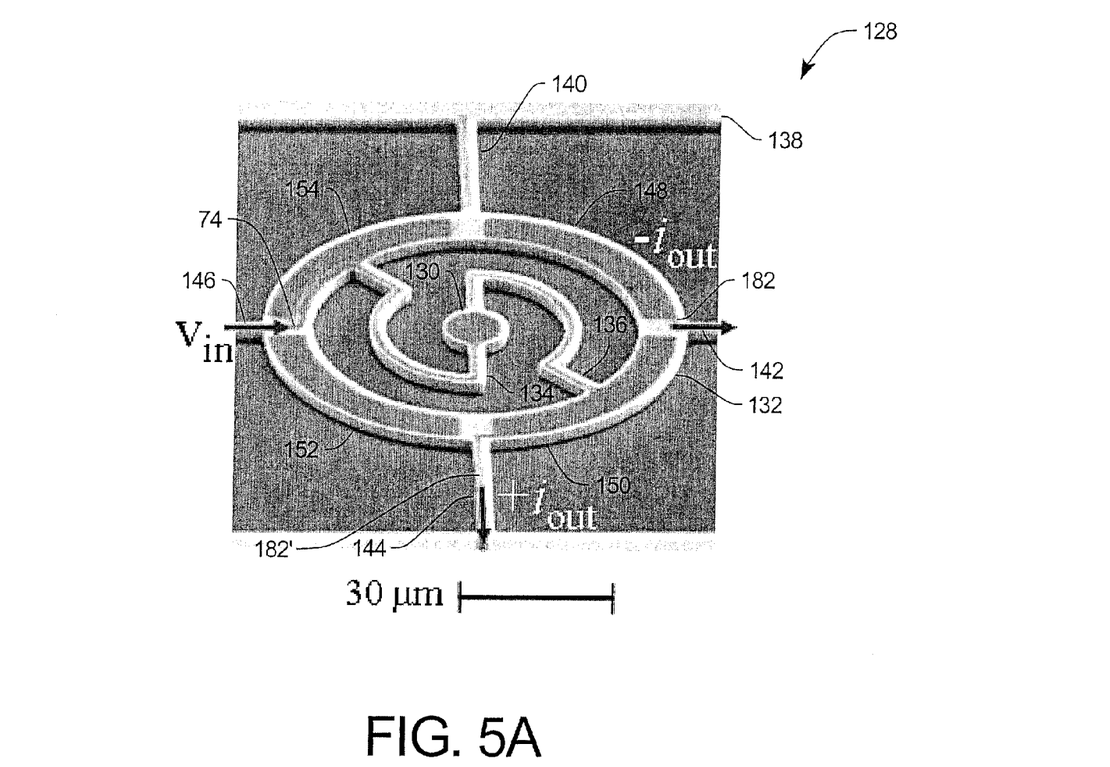
FIG. 5A is a SEM photograph of an embodiment of a single-ended to differential MEMS filter.
Figure 8A:
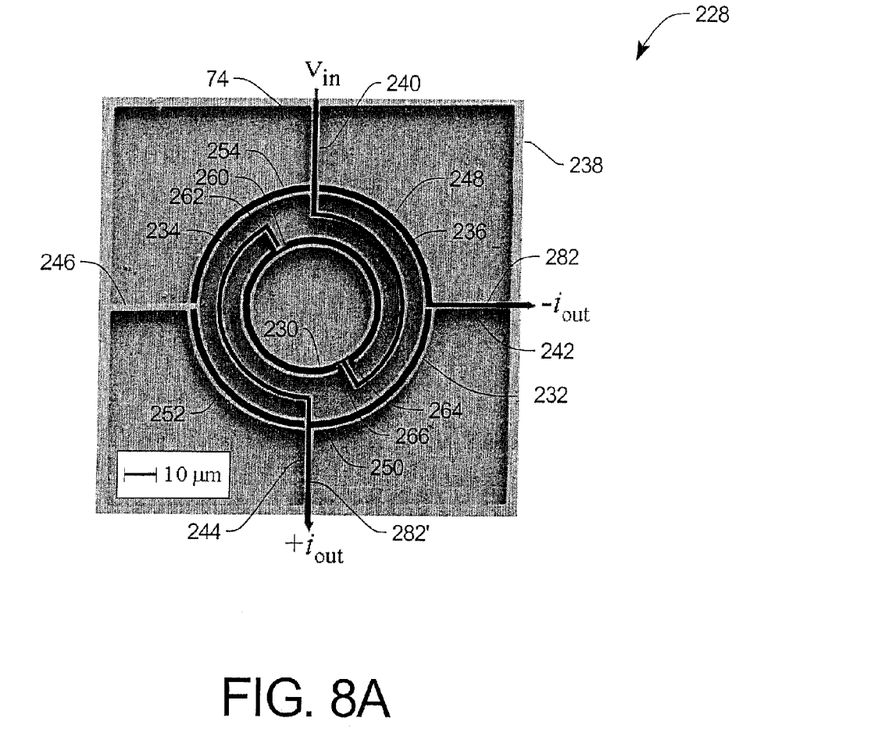
FIG. 8A is a SEM photograph of another embodiment of a single-ended to differential MEMS filter.

FIGS. 4A, 4B, 4C, 4D, and 4E are side cross-sectional views showing an embodiment of processing steps used in fabricating the filters shown in FIGS. 5A and 8A. The process uses three masks and can be readily integrated into any CMOS or similar process. The filter of the first embodiment is fabricated on base, for example a 3 micron thick SOI wafer 90. A dielectric layer, for example 30 nm layer of hafnium dioxide 92 (having a dielectric constant of approximately 28 and an acoustic velocity of 8500 m/s) is deposited on the base for the filter shown in FIG. 5A (the filter of FIG. 8A uses a 20 nm layer of hafnium dioxide), using atomic layer deposition, patterned, and etched as shown in FIG. 4A. Depositing the dielectric layer directly on the base has the advantage that it is relatively simple to include in a manufacturing process when compared with other methods which might try to deposit dielectric material between electrodes. 50 and 20 nm thick polysilicon electrode layers 74 and 82, respectively, are then deposited and doped as shown in FIG. 4B, and then patterned and etched (FIG. 4C). A further advantage of forming the electrode layer after the dielectric layer is that the surface area of the electrodes may be increased, which decreases the motional impedance, and allows for a larger choice of resonators. A DRIE substrate etch defines the resonator structure as shown in FIG. 4D. Finally, the SOI device layer is etched and released (FIG. 4E).

FIG. 5A is a SEM picture of a first embodiment of a single-ended to differential filter 128 of the single-ended to differential filter 22 of FIG. 1. The single-ended to differential filter 128 is comprised of two concentric resonators: an inner disk resonator 130 and an outer wine glass resonator 132. The inner disk resonator 130 has a radius of approximately 6.25 µm. The outer concentric wine glass ring 132 has an inner radius of approximately 32.6 µm, and an outer radius of approximately 42.3 µm. The inner disk resonator 130 is dielectrically actuated to induce the dielectric transduction contour shown in FIG. 5B. Mechanical coupling beams 134 and 136 from the inner disk resonator 130 to the concentric ring resonator 132 to drive the concentric ring resonator 132 in a wine glass mode and thereby induce the dielectric transduction contour shown in FIG. 5B. The bias voltage and AC signal of FIG. 3A are applied to the input polysilicon layer 74 and the DC bias voltage of FIG. 3B is applied to the $-i_{OUT}$ polysilicon layer 182 and the $+i_{OUT}$ polysilicon layer 182'.

The filter 128 is supported within a frame 138, the upper and lower edges of which are shown in FIG. 5A, which provides anchor points of the outer ends of four quarter wavelength beams 140, 142, 144, and 146 that connect to the outer wine glass resonator 132. The AC input signal $V_{in}$ is routed on the polysilicon layer 74 to the polysilicon layer in the inner disk resonator 130 on the mechanical coupling beam 134. The outer wine glass resonator 132 has four separate areas of polysilicon, one for each of four quadrants 148, 150, 152, and 154 which are between the four quarter wavelength beams 140 and 142, 142 and 144, 144 and 146, and 146 and 140, respectively. The polysilicon 282' in the quadrant 150 is connected to a $+i_{out}$ output at the outer end of the quarter wavelength beam 144 and also to the polysilicon on the coupling beam 136, but not to the polysilicon on the inner disk resonator 130. The polysilicon 182 in the sector 148 is connected to a $-i_{out}$ output at the outer end of the beam 142. The polysilicon layers 184 and 186 in each of the sectors 152 and 154, respectively, are isolated.

In this design and the design shown in FIG. 5A, the coupling springs' stiffness is reduced by ensuring a flexure mode coupling. The mechanical coupling beams 134 and 136 are implemented using perpendicular arc segments to ensure a flexure mode coupling between the inner disk resonator 130 and the concentric ring resonator 132. There are many possible variations on the coupling beams, including lower velocity coupling, thinner beams, meander beams, nanotubes or nanowires. A smaller coupling stiffness results in narrow bandwidth and small ripple. The filter is suspended from the quasi-nodes of the wine glass ring 132. The anchor beams 140, 142, 144, and 146 are frequency-matched to reflect back energy of the wine glass resonant mode but act as an energy sink for undesired ring modes. Although the single-ended to differential filter shown in the SEM picture in FIG. 5A does not generate a 1:4 impedance transformation to match a 50Ω input to a 200Ω output, the embodiment of FIG. 5A could generate a 1:4 impedance transformation by adjusting the resonant nodes. The motional impedance of each resonator 30 and 32 is given by $$R_X = \left(\frac{\partial C}{\partial t}\right)^{-1} \frac{v_{AC}}{V_{DC}}$$

where C is the active capacitance between the electrodes and the resonator, $V_{DC}$ is the bias voltage applied between the electrodes and resonator, and $v_{AC}$ is the input signal. To a first order for dielectric transduction, the motional impedance of the resonator is $$R_X = \left(\frac{Q v_f \kappa_f \varepsilon_0 A \omega}{h_f^2} u_{max}\right)^{-1} \frac{v_{AC}}{V_{DC}}$$

where Q is the quality factor, A is the electrode area, $v_f$ is the dielectric film Poisson ratio, $\kappa_f$ is the film relative dielectric constant, ω is the angular frequency of vibration, and $\in_0$ is the permittivity of air. $u_{max}$ is the maximum displacement of the resonant motion and is proportional to $v_{AC}$ so that the impedance is independent of the input signal, as expected. The mode displacement $u_{max}$ of the ring and disk resonators is approximated here by $$u_{max} = \frac{v_f \kappa_f \varepsilon_0 V_{DC} v_{AC}}{E_{Si}} \frac{w}{b h_f}$$

to demonstrate its dependence on material properties and geometric factors. However, a more precise mode displacement is found only by integrating over the resonant mode shape. Here, $E_{Si}$ is the elastic modulus of the silicon resonator, b is the resonator thickness, $h_f$ is the dielectric film thickness, and w is the dimension of resonant motion. In the case of a ring, w is just the width of the ring ($R_{out}$-$R_{in}$) For a disk, w is the disk radius.

Given these formulas, one can easily construct a single-ended to differential resonator with 50Ω input and 200Ω output. To obtain the desired impedances, the dielectric film thickness, dielectric constant, and electrode area can be adjusted. For example, the radial disk inner resonator 130 can be replaced with a breathing mode annulus as in FIG. 8A which does achieve a 1:4 impedance transformation to match a 50Ω input to a 200Ω output. The annulus width w for the breathing mode is 10 µm for a resonance frequency of 425 MHz. For a 20 nm hafnia-transduced ring with an inner radius of 18 µm and bias voltage of 10 V, the motional impedance is about 80Ω. Final tuning of the resonator impedance can be achieved by adjusting the bias voltage $V_{DC}$ on that resonator, using a bias-T circuit. As explained in Paragraph [00035], the motional impedance of each resonator is proportional to the inverse square of the applied bias voltage ($R_X \propto 1/V_{DC}^2$), If the motional impedance is not perfectly matched to the input or output (due to fabrication variations, difficulty in filter design, etc.), this bias voltage can be adjusted for fine tuning of the motional impedance for both resonators. For more impedance matching control, one can apply different bias voltages to each resonator. This can be achieved by applying a constant voltage (taken here to be ground) to the bodies of the two resonators, but applying different bias voltages $V_{DC,input}$ and $V_{DC,output}$ to the input and output electrodes, respectively, using a bias-T on each electrode. The motional impedance of the input resonator is then $R_{X,input} \propto 1/V_{DC,input}^2$ and the motional impedance of the output resonator is $R_{X,output} \propto 1/(V_{DC,input} V_{DC,output})$. Here, one factor of $V_{DC,input}^{-1}$ comes from $u_{max}$, the maximum motional displacement of each resonator. The second $V_{DC}^{-1}$ term comes from the voltage across each electrode, which is different for the two resonators. In this biasing configuration, the motional impedance of the input and output resonators can be tuned independently. First, $V_{DC,input}$ can be adjusted to match the 50 Ω input impedance. Then, with $V_{DC,input}$ fixed at the desired voltage, $V_{DC,output}$ can be adjusted to obtain a 200 Ω output impedance. The same principle applies for the outer differential resonator. Each quadrant electrode of the wine glass ring implemented in the single-ended to differential filter prototype, transduced with a 20 nm hafnia layer and a bias voltage of 10 V, has an output impedance of 210Ω. In this case, the bias voltage may be reduced, and symmetric electrode signals combined to generate a total impedance of 200Ω at the output.

Figure 5B:
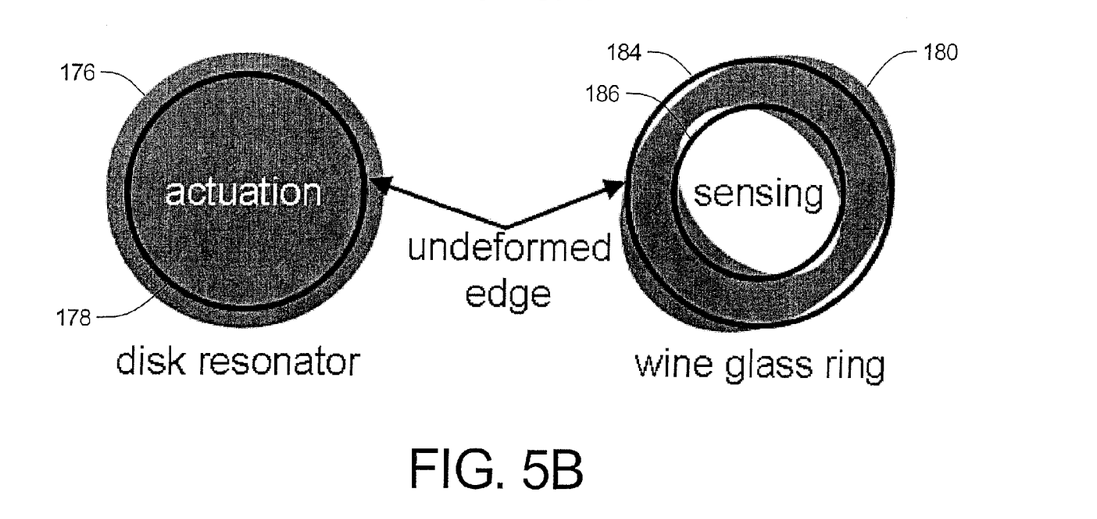
FIG. 5B is a representation of the dielectric transduction occurring in the filter shown in FIG. 5A.

FIG. 5B is a representation of the dielectric transduction occurring in the filter shown in FIG. 5A. The dielectric transduction pattern 176 of the inner disk resonator 130 move both radially inward and away from the center of the inner disk resonator 130 around the inner disk resonator 130, the solid line 178 representing the outside of the circumference of the inner disk resonator 130. As can be seen, the dielectric transduction pattern 180 occurring in the wine glass resonator 132 is ellipsoidal, the solid lines 184 and 186 representing the outside and inside, respectively, of the wine glass resonator 132.

Figure 6:
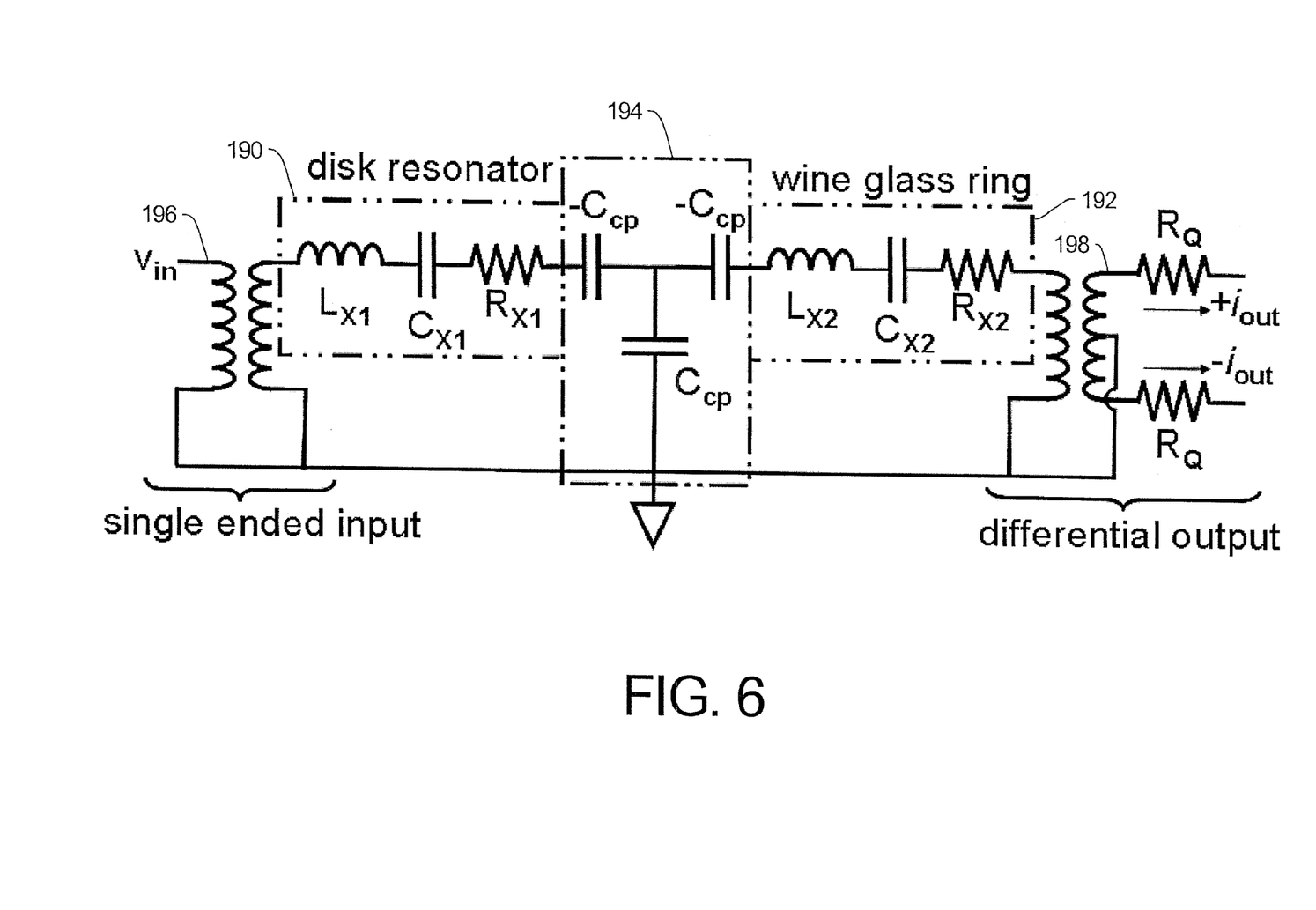
FIG. 6 is an equivalent schematic diagram of the filter embodied in FIGS. 5A

FIG. 6 is an equivalent circuit of the single-ended to differential filters shown in FIGS. 5A and 8A. The second-order electromechanical filter is modeled electrically by two resonator RLC circuits 190 and 192 coupled through a capacitive T 194. For circuit analysis purposes input and output transformers 196 and 198 have been added to FIG. 6 with an input signal $V_{in}$ connected to one terminal of the primary winding of the first transformer 196 and one secondary winding terminal connected to the resonator RLC circuit 190. The resonator RLC circuit 192 is connected to one terminal of the primary winding of the second transformer 198 which, in turn, provides differential outputs to drive two load resistors $R_o$ from the secondary winding of the second transformer 198. The second terminals of the primary and secondary windings of the transformer 196, the second terminal of the primary of the transformer 198, and a center tap of the secondary winding of the transformer 198 are connected to ground as is one plate of the shunt capacitor $C_{cp}$. When the resonator circuits 190 and 192 oscillate in phase, the current flowing through the shunt capacitor $C_{cp}$ is minimized. When the resonator circuits 190 and 192 are out of phase, the current though the coupling shunt capacitor $C_{cp}$ is at its maximum. In the mechanical domain, this corresponds to a minimal relative displacement of the coupling beam for in-phase resonance and a maximum beam displacement for out-of-phase resonance. In this model, feedthrough capacitance is negligibly small due to the large distance between drive and sense electrodes.

For a 30 nm thick hafnium dioxide dielectric layer, a numerical derivation of the radial disk mode yields $R_{x1}$=590Ω, $L_{x1}$=1.1 mH, and $C_{x1}$=127 aF. The wine glass ring has $R_{x2}$=93Ω, $L_{x2}$=0.17 mH, and $C_{x2}$805 aF. The coupling capacitance $C_{cp}$ is proportional to the effective dielectric constant of the capacitor $C_{cp}$. There is a distinct tradeoff between insertion, shape factor, and bandwidth.

Figure 7:
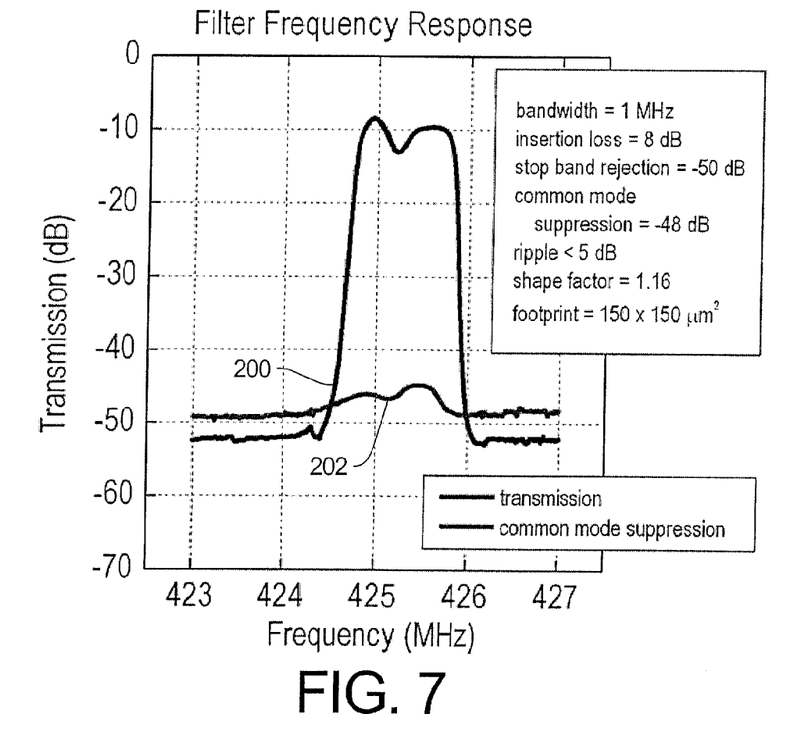
FIG. 7 is a plot of test results for the MEMS filter embodied in FIG. 5A.

FIG. 7 is a plot of the test results for the single-ended to differential filter shown in FIG. 5A. The test results show the 1 MHz BW filter transmission response 200 for a bias voltage of 5 V and termination impedance of 4.8 kΩ at a center frequency of 425 MHz. An IL of 8 dB, shape factor of 1.16, stop band rejection of −50 dB, and −48 dB common mode suppression are observed. The common mode suppression shown by curve 202 improved by 20 dB over electrically coupled filters disclosed in an article by G. G. Fattinger, et al, "Single-to-balanced Filters for Mobile Phones using Coupled Resonator BAW Technology," *Ultrasonics* 2004, pp. 416-419 due to the differential mechanical nature of the wine glass ring eigenmode. The filter of FIG. 5A has a relatively large insertion loss due to mismatch in the motional impedances of the constituent resonators 130 and 132. This can be improved by increasing the size of the inner disk 130 and matching its second order radial mode to the wine glass resonant frequency.

Thus the single-ended to differential design of this first embodiment shown in FIG. 5A and the second embodiment shown in FIG. 5A couple an intrinsically single-ended driving resonant mode to an inherently differential sensing resonant mode, optimize electrode area, can provide a 1:4 impedance transformation in the FIG. 5A embodiment, and does provide a 1:4 impedance transformation in the FIG. 8A embodiment. This single-ended to differential filter 128 provides a channel-select switchable low-power electromechanical alternative for front-end RF circuits, eliminating the need for bulky off-chip baluns and external RF switches. The high inductance and low capacitance of the dielectrically transduced resonators 130 and 132 comprising the filter provide a small shape factor for small bandwidth applications. Mechanical coupling greatly improves feedthrough capacitance, while the inherently differential mode shape of the wine glass ring provides low common mode suppression.

FIG. 8A is a SEM picture of a second embodiment of a single-ended to differential filter 228, similar to the first embodiment of FIG. 5A, of the single-ended to differential filter 22 of FIG. 1. The single-ended to differential filter 228 is comprised of two concentric resonators, an inner breathing mode ring or annulus resonator 230 and an outer wine glass resonator 232. The inner annulus resonator 230 has an inside radius of approximately 1.85 μm and an outside radius of approximately 2.23 μm. The outer concentric wine glass ring 232 has an inner radius of approximately 3.48 μm, and an outer radius of approximately 3.88 μm. The inner annulus resonator 230 is dielectrically actuated to induce the dielectric transduction contour shown in FIG. 8B. Mechanical coupling beams 234 and 236 from the inner annulus resonator 230 to the concentric ring resonator 232 drive the concentric ring resonator 232 in a wine glass mode and thereby induce the dielectric transduction contour shown in FIG. 8B. The bias voltage and AC signal of FIG. 3A are applied to the input polysilicon layer 74 and the DC bias voltage of FIG. 3B is applied to the $-i_{out}$ polysilicon layer 282 and the $+i_{out}$ polysilicon layer 282'.

The filter 228 is supported within a frame 238, which provides anchor points of the outer ends of four quarter wavelength beams 240, 242, 244, and 246 that connect to the outer wine glass resonator 232. The AC input signal $V_{in}$ is routed on the polysilicon layer 74 to the polysilicon layer in the aunulus resonator 230 on the mechanical coupling beam 236. The outer wine glass resonator 232 has four separate areas of polysilicon, one for each of four quadrants 248, 250, 252, and 254 between the four quarter wavelength beams 240 and 242, 242 and 244, 244 and 246, and 246 and 240, respectively. The polysilicon 282' in the quadrant 250 is connected to a $+i_{out}$ output at the outer end of the quarter wavelength beam 244, and the polysilicon 282 in the sector 248 is connected to a $-i_{out}$ output at the outer end of the beam 42. The polysilicon 282' is also on the coupling beam 234, but isolated from the polysilicon on the inner aunulus resonator 230. The polysilicon layers 284 and 286 in each of the sectors 252 and 254, respectively, are isolated.

Four notches 260, 262, 264, and 266 in the inner annulus resonator 232 at the junctions with the coupling beams 234 and 236 facilitate the coupling between the inner disk resonator 232 and the coupling beams 234 and 236.

Figure 8B:
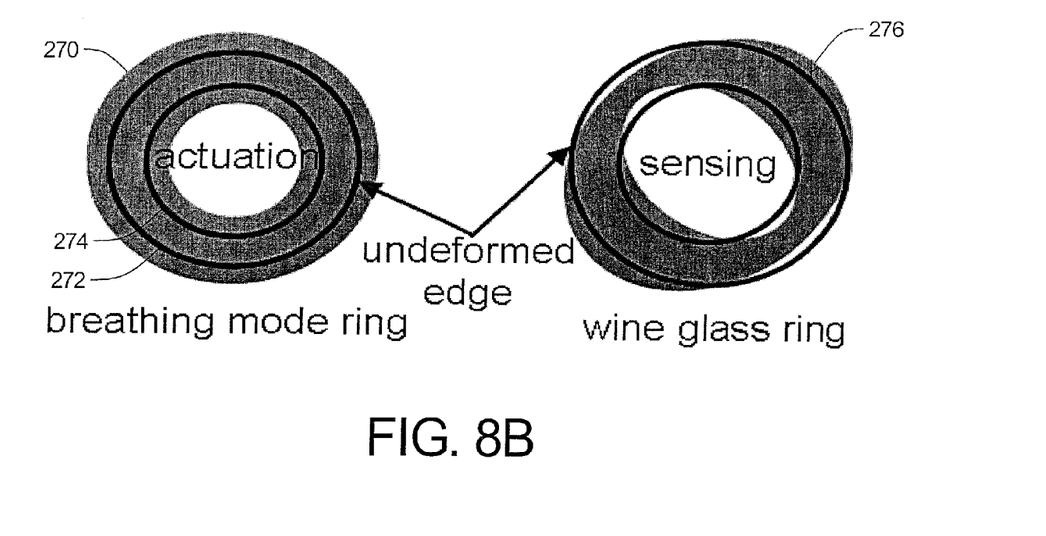
FIG. 8B is a representation of the dielectric transduction occurring in the filter shown in FIG. 8A.

FIG. 8B is a representation of the dielectric transduction occurring in the filter shown in FIG. 5A. Analogous to the dielectric transduction patterns shown in FIG. 5B, the dielectric transduction pattern 270 of the annulus resonator 230 moves both radially inward and away from the center of the breathing mode ring 230, the solid lines 272 and 274 representing the outside and the inside, respectively, of the circumference of the breathing mode ring 232. As can be seen, the dielectric transduction pattern 276 occurring in the wine glass ring 232 is the same as the pattern shown in FIG. 5B.

Figure 9:
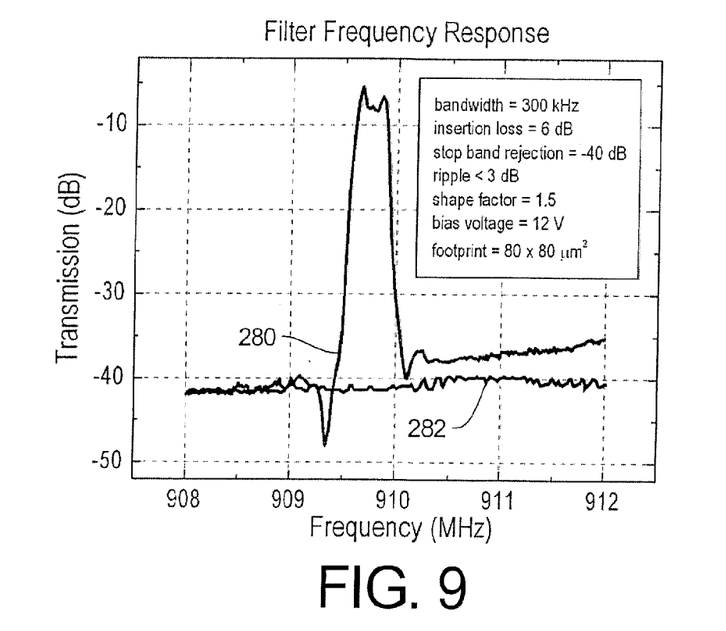
FIG. 9 is a plot of test results for the MEMS filter embodied in FIG. 8A.

FIG. 9 is a plot of the test results for the single-ended to differential filter shown in FIG. 8A. The test results show the 300 kHz BW filter transmission response 280 for a bias voltage of 12 V and termination impedance of 50Ω at a center frequency of 907 MHz. An IL of 6 dB, shape factor of 1.5, and a stop band rejection of −40 dB are observed. The curve 282 are the test results when either of the bias voltages 76 or 84 of 12 V is removed, effectively creating an open circuit between the input and the two outputs of the filter.

Figure 10:
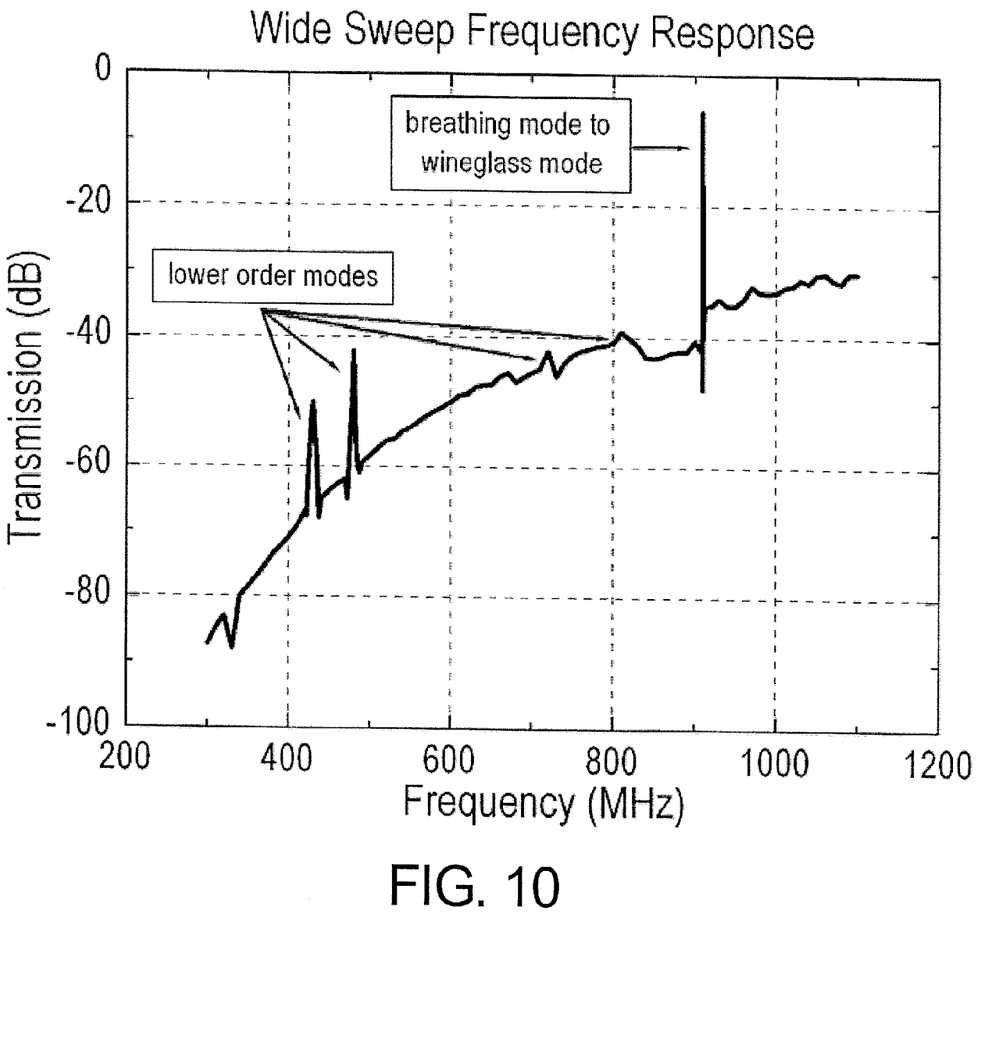
FIG. 10 is a plot of test results for the MEMS filter embodied in FIG. 8A over a wider frequency range than that illustrated in FIG. 9.

Thus the single-ended to differential design of this second embodiment, like the filter of the first embodiment, couples an intrinsically single-ended driving resonant mode to an inherently differential sensing resonant mode and provides a 1:4 impedance transformation. This single-ended to differential filter provides a channel-select switchable low-power electromechanical alternative for front-end RF circuits, eliminating the need for bulky off-chip baluns and external RF switches. The high inductance and low capacitance of the dielectrically transduced resonators 230 and 232 comprising the filter provide a small shape factor for small bandwidth applications. Mechanical coupling greatly improves feedthrough capacitance, while the inherently differential mode shape of the wine glass ring provides low common mode suppression. FIG. 10 is a plot of the test results for the single ended to differential filter shown in FIG. 8A over a wider frequency range than that shown in FIG. 9. As can be seen in FIG. 10 there are lower order modes present in the filter of FIG. 8A, however they produce out-of-band amplitude spikes that are essentially no greater than the transmission amplitude at the frequencies just outside the passband of the filter.

Figure 11:
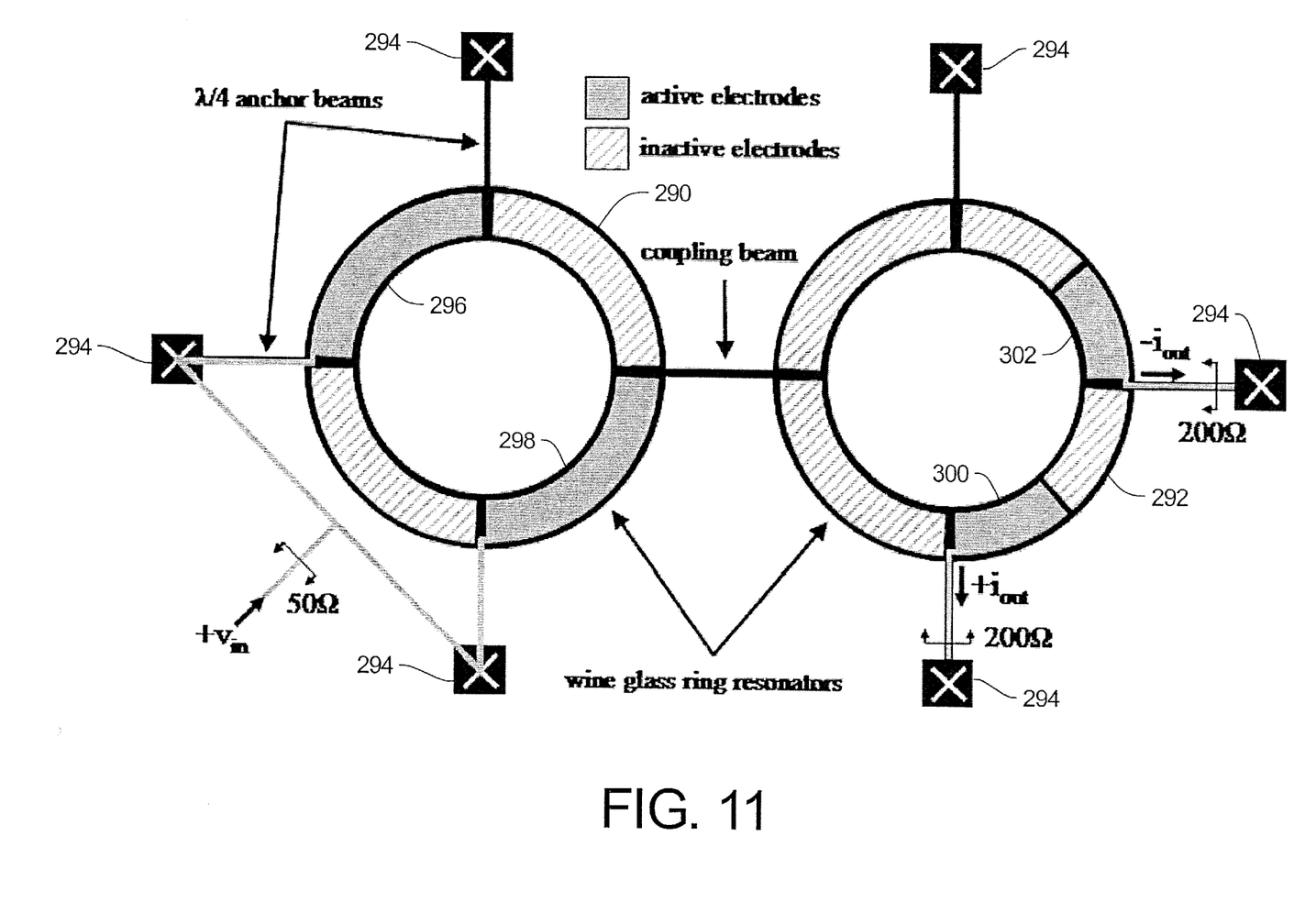
FIG. 11 schematically illustrates a further embodiment of a MEMS filter.

FIG. 11 schematically illustrates another embodiment of a MEMS filter. This embodiment is a fully differential filter which can be used in a single-ended to differential configuration. The filter has two softly-coupled wine glass rings 290 and 292. The rings are anchored and coupled at their quasi-nodal points 294. Opposite quadrants of the wine glass rings 290 and 292 are in phase, while adjacent quadrants are out of phase. Consequently, a single-ended input excitation of the wine glass ring requires use of only two opposing electrodes 296 and 298. Counting the unused input electrode areas with the used input electrode areas, the used electrode area at the output is ¼ the input electrode area, to generate an internal 1:4 impedance transformation, matching the input to a 50Ω antenna and output to 200 Ω LNA inputs. Thus the electrode design is necessarily sub-optimal. Half of the input electrode area is unused due to the differential nature of the excited resonant mode. At the output, ¾ of the electrode area is wasted for impedance matching. The input impedance of this filter can easily be matched to 50Ω with dielectric transduction methods. Adjacent electrodes 300 and 302 are used to extract a 200Ω matched balanced signal. However, only one half quadrant can be used to pick off each signal.

As stated above, the fully differential mechanical filters of FIG. 11 can be used in two ways. A single-ended input signal can be converted into a differential input signal with an off-chip balun; each line of the differential input signal is then fed to a separate pair of opposite input resonator electrodes. Alternately (as illustrated in FIG. 11), the fully differential filter can be excited with a single-ended signal (whereby no balun is needed), forming an unoptimized single-ended to differential filter. Identical differential-mode resonators coupled in this filter and operated in this way do not readily provide the 1:4 impedance transformation forced by the balun or single-ended to differential filter. This transformation is necessary to match the filter input impedance to the antenna and the output impedance to the LNA as shown in FIG. 1. In order to generate a 1:4 impedance transformation in the fully differential filter, the output electrodes must be reduced in area by a factor of 4, further sacrificing output signal.

Embodiments of MEMS filters having resonators have been shown and described, along with various advantages. In the illustrated embodiments the differential resonator (aka output resonator) is a wine-glass resonator, but other types of differential resonators, as well as other types of single-ended resonators (aka input resonators), known to those skilled in the art can be used. For example, but not limited to, wine glass disk, Lame-mode square, or 2nd-order thickness-shear ring resonators can used for the differential resonator, and longitudinal mode bar, breathing mode square, or antisymmetric thickness-shear bar resonators can be used for the single-ended resonator.

While reference has been made to various embodiments, it should be understood that numerous changes may be made within the spirit and scope of the inventive concepts described. Accordingly, it is intended that the invention not be limited to the described embodiments, but will have full scope defined by the language of the following claims and their equivalents.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means" for performing a specified function or "step" for performing a specified function should not be interpreted as a "means" or "step" clause as specified in 35 U.S.C. §112.

What is claimed is:

1. A MEMS filter, comprising:
an input layer for receiving a single-ended signal input;
an output layer for providing a differential signal output;
a first resonator; and
a second resonator coupled to the first resonator such that movement transduced in the first resonator by the single-ended signal input causes movement of the second resonator which transduces the differential signal output.

2. The MEMS filter of claim 1, wherein the coupling between the resonators is such that an input impedance of the filter is substantially matched to a differing output impedance of the filter.

3. The MEMS filter of claim 2, wherein the input impedance comprises an antenna impedance and the output impedance comprises a low-noise-amplifier (LNA) impedance.

4. The MEMS filter of claim 3, wherein the antenna impedance comprises approximately 50 ohms and the LNA impedance comprises approximately 200 ohms.

5. The MEMS filter of claim 1 wherein the first and second resonators are concentric.

6. The MEMS filter of claim 5, wherein the first resonator comprises an inner disc and the second resonator comprises a wine glass resonator.

7. The MEMS filter of claim 5, wherein the first resonator comprises a first wine glass resonator and the second resonator comprises a second wine glass resonator.

8. The MEMS filter of claim 5, further comprising a frame, wherein:
the second resonator is coupled to the frame by at least one anchor beam; and
the first resonator is coupled to the second resonator by a plurality of coupling beams.

9. The MEMS filter of claim 8, wherein the plurality of coupling beams comprise perpendicular arc segments.

10. The MEMS filter of claim 8, wherein the second resonator is coupled to the frame by four anchor beams.

11. The MEMS filter of claim 10, wherein each of the four anchor beams is attached to the second resonator at a different quasi-nodal point around the second resonator.

12. The MEMS filter of claim 1, wherein the first resonator comprises a first dielectric layer and the second resonator comprises a second dielectric layer, wherein:
the single-ended signal input creates a vertical compression of the dielectric layer which drives the transduced movement of the first resonator; and
the caused movement of the second resonator creates a stress propagation of the second dielectric layer which can be used to transduce the differential signal output.

13. The MEMS filter of claim 12, wherein the first resonator and the second resonator further comprise silicon, and the first dielectric layer and the second dielectric layer comprise hafnium dioxide.

14. The MEMS filter of claim 12, wherein the input layer and the output layer comprise a doped polysilicon.

15. The MEMS filter of claim 1, further comprising a switched input coupled to the input layer for selectively providing RF signals to the input layer.

16. The MEMS filter of claim 1, further comprising a frame, wherein:
the first resonator is coupled to the frame by a first plurality of anchor beams;
the second resonator is coupled to the frame by a second plurality of anchor beams; and
the first resonator is coupled to the second resonator by at least one coupling beam.

17. The MEMS filter of claim 16, wherein:
the first plurality of anchor beams are coupled to the first resonator at quasi-nodal points on the first resonator; and
the second plurality of anchor beams are coupled to the second resonator at quasi-nodal points on the second resonator.

18. The MEMS filter of claim 17, wherein the at least one coupling beam is coupled to:
the first resonator at a quasi-nodal point of the first resonator; and
the second resonator at a quasi-nodal point of the second resonator.

19. The MEMS filter of claim 1, wherein the input layer comprises at least one active input electrode which is coupled over at least part of the first resonator, and configured to receive a single-ended input.

20. The MEMS filter of claim 19, wherein the input layer comprises two input electrodes coupled over opposite quadrants of the first resonator, and configured to receive a single-ended input.

21. The MEMS filter of claim 1, wherein:
the first resonator is selected from the group consisting of a wine glass resonator, a disk resonator, a longitudinal mode bar resonator, a breathing mode square resonator, and an antisymetrical thickness-shear bar resonator; and
the second resonator is selected from the group consisting of a wine glass resonator, a wine glass disk resonator, a Lame-mode square resonator, and a second-order thickness ring resonator.

22. A method of manufacturing a MEMS filter, comprising:
forming an input dielectric layer and an output dielectric layer on a base;
forming an input patterned electrode layer at least in part on the input dielectric layer;
forming an output patterned electrode layer at least in part on the output dielectric layer;
etching the base to define a first resonator structure and a second resonator structure coupled to the first resonator structure such that movement transduced in the first resonator structure by an input signal applied to the input patterned electrode layer causes movement in the second resonator structure which transduces an output signal in the output patterned electrode layer; and
wherein:
a) the first resonator structure and the input patterned electrode layer are coupled at least in part by the input dielectric layer; and
b) the second resonator structure and the output patterned electrode layer are coupled at least in part by the output dielectric layer.

23. The method of claim 22 wherein the base comprises silicon.

24. The method of claim 22 wherein forming the input dielectric layer and the output dielectric layer comprises depositing, patterning, and etching the the input and output dielectric layers.

25. The method of claim 22, wherein the input dielectric layer and the output dielectric layer comprise hafnium dioxide.

26. The method of claim 22, wherein the input electrode layer and the output electrode layer comprise doped polysilicon.

27. The method of claim 22, wherein etching the base to define first and second resonator structures comprises a deep reactive ion etching (DRIE) process.

28. A resonator made using the process of claim 22.

29. A method of adjusting a desired input impedance and an output impedance of a dielectrically transduced MEMS filter having transduction electrodes coupled to a dielectric film, comprising adjusting a DC bias voltage on the transduction electrodes.

30. A radio frequency (RF) apparatus, comprising:
a) an input configured to receive an input RF signal;
b) a plurality of MEMS filters, each comprising:
   i) an input layer for receiving a single-ended signal input;
   ii) an output layer for providing a differential signal output;
   iii) a first resonator; and
   iv) a second resonator coupled to the first resonator such that movement transduced in the first resonator by the single-ended signal input causes movement of the second resonator which transduces the differential signal output, and wherein the first and second resonators are tuned to allow a band of frequencies to pass from the single-ended signal input to the differential signal output; and
wherein the band of frequencies allowed to pass from the signal input to the signal output in each of the plurality of MEMS filters is different;
c) switching circuitry which routes the input RF signal to a desired MEMS filter from the plurality of MEMS filters; and
d) an output configured to provide the differential signal output from the desired MEMS filter.

31. A MEMS filter, comprising:
a frame;
an output resonator coupled to the frame by anchor beams;
an input resonator coupled to the output resonator by at least one coupling beam;
an input dielectric layer covering at least part of the input resonator;
an output dielectric layer covering at least part of the output resonator;
an input electrode covering at least part of the input dielectric layer and configured to receive an input signal comprising an input DC bias voltage and a single-ended RE voltage signal from a device with a first impedance, wherein the combination of the input DC bias voltage and the single-ended RE voltage signal compresses the input dielectric layer and drives a movement of the input resonator;
a first output electrode covering at least part of the output dielectric layer;
a second output electrode covering at least another part of the output dielectric layer;
wherein the first and second output electrodes are configured to receive an output DC bias voltage;
wherein movement of the input resonator tends to cause movement of the output resonator depending on the characteristics of the input signal, the input DC bias voltage, the anchor beams, the at least one coupling beam, the input dielectric layer, and the input electrode; and
wherein movement of the of the output resonator creates a differential output signal at a second impedance between the first output electrode and the second output electrode depending on characteristics of the output DC bias voltage, the output dielectric layer, the first output electrode, and the second output electrode.

32. The MEMS filter of claim 31, wherein the output resonator is a wine glass resonator.

33. The MEMS filter of claim 32, wherein the input resonator is a wine glass resonator.

34. The MEMS filter of claim 32, wherein the input resonator and the output resonator are concentric.

35. The MEMS filter of claim 34, wherein the input resonator is a wine glass resonator.

36. The MEMS filter of claim 34, wherein the input resonator is a disc.

* * * * *